(12) United States Patent
Thirunakkarasu et al.

(10) Patent No.: US 8,493,255 B2
(45) Date of Patent: Jul. 23, 2013

(54) HIGH SPEED, HIGH VOLTAGE MULTIPLEXER

(75) Inventors: Shankar Thirunakkarasu, Tucson, AZ (US); Robert E. Seymour, Tucson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 139 days.

(21) Appl. No.: 13/034,438

(22) Filed: Feb. 24, 2011

(65) Prior Publication Data

US 2012/0218133 A1 Aug. 30, 2012

(51) Int. Cl.
*H03M 1/12* (2006.01)
*G11C 27/02* (2006.01)

(52) U.S. Cl.
CPC ........... *H03M 1/1245* (2013.01); *G11C 27/024* (2013.01)
USPC ............................ 341/141; 327/407; 327/382

(58) Field of Classification Search
USPC .................................. 341/141; 307/407, 408
See application file for complete search history.

(56) References Cited

U.S. PATENT DOCUMENTS

| | | | |
|---|---|---|---|
| 5,638,072 A | 6/1997 | Van Auken et al. | |
| 6,052,000 A * | 4/2000 | Nagaraj | 327/94 |
| 6,404,237 B1 | 6/2002 | Mathew et al. | |
| 6,525,574 B1 * | 2/2003 | Herrera | 327/94 |
| 6,667,707 B2 | 12/2003 | Mueck et al. | |
| 6,707,403 B1 | 3/2004 | Hurrell | |
| 7,064,599 B1 | 6/2006 | Taft et al. | |
| 7,268,610 B2 | 9/2007 | Keskin | |
| 7,471,135 B2 | 12/2008 | Raghavan et al. | |
| 2002/0175740 A1 | 11/2002 | Ruegg et al. | |
| 2010/0283643 A1 | 11/2010 | Byrne et al. | |
| 2011/0304492 A1 * | 12/2011 | Mandal et al. | 341/150 |

OTHER PUBLICATIONS

PCT Search Report mailed Dec. 21, 2012.

* cited by examiner

*Primary Examiner* — Howard Williams
(74) *Attorney, Agent, or Firm* — Alan A. R. Cooper; Wade J. Brady, III; Frederick J. Telecky, Jr.

(57) ABSTRACT

A method for digitizing at least a portion of a selected analog input signal of a plurality of analog input signals by using a multiplexer having a plurality of channels is provided. Each channel for the multiplexer is associated with at least one of the analog input signals and is associated with a pair of select signals, and wherein each channel includes a cell having an input terminal, an output terminal, and a boosted NMOS switch. According to the method, a first select signal from each pair of select signals is asserted to decouple the input and output terminals for each cell. A boost capacitor is also charged during the non-sampling or conversion phase while the first select signal from each pair of select signals is asserted. A second select signal that is associated with the selected analog input signal is then asserted so as to couple together the input and output terminals for the cell associated with the selected analog input signal and to provide a voltage stored on the boost capacitor to the associated boosted NMOS switch. The portion of the selected analog input signal is then digitized.

14 Claims, 5 Drawing Sheets

HIGH SPEED, HIGH VOLTAGE MULTIPLEXER

TECHNICAL FIELD

The invention relates generally to a multiplexer and, more particularly, to a high speed, high voltage multiplexer that is generally used with an analog-to-digital converter (ADC).

BACKGROUND

Turning to FIGS. 1 and 2, a conventional multi-channel data converter system 100 can be seen. This system 100 generally comprises a multiplexer or mux 102, an ADC 104 (which can be a successive approximation register or SAR ADC operating at 250 kSPS), boost logic 106, and select logic 108. Typically, mux 102 receives several analog input signals IN1 to INN so as to provide ADC 104 with a multiplexed analog signal that is converted (by ADC 104) to a digital output signal DOUT. Boost logic 106 and select logic 108 generally perform the interleaving of the analog input signals IN1 to INN (using select signals SEL1 to SELN) based on the sample signal SAMPLE. Mux 102 (which can be seen in greater detail in FIG. 2) is generally comprised of cells 202-1 to 202-N (where each corresponds to a channel of mux 102). Each cell 202-1 to 202-N generally and respectively comprises switches S1-1 to S5-1 through S1-N to S5-N, a capacitor C1 to CN, transistors Q1-1 to Q3-1 through Q1-N to Q3-N (which are each generally NMOS transistors), and transmission gates 204-1/206-1 to 204-N/206-N.

As can be seen from system 100, the operation of mux 102 (which can be seen in greater detail in FIG. 2) is generally dependant on the phase of the sample signal SAMPLE. Initially, capacitors C1 to CN are charged to the voltage on positive rail HPVDD by deasserting select signals SEL1-A to SELN-A and asserting select signals SEL1-B to SELN-B. Following the charging of capacitors C1 to CN and as an example, if it is assumed that channel 1 (cell 202-1) is selected, then the select signal SEL1-A is asserted, while SEL1-B (and SEL2-A/SEL2B to SELN-A/SELN-B) are deasserted. This allows the voltage from input signal IN1 at the sampling instant plus the voltage stored on capacitor C1 (i.e., +15V) to initially be applied to the gates of switches Q1-1 and Q2-1. As the boosted voltage is applied, the input signal's IN1 voltage at the sampling instant is transmitted through the switch Q1-1 and transmission gate 204-1 to switch Q2-1 and transmission gate 206-1 (which generally perform the same function as switch Q1-1 and transmission gate 204-1). The switches Q2-1/Q3-1 to Q2-N/Q3-N and transmission gates 206-1 are generally provided to reduce crosstalk because these components generally eliminate the parasitic capacitance between the input and output.

While the cells 202-1 to 202-N generally do reduce crosstalk (in part because of the grounding provided through switches Q3-1 to Q3-N), there are some drawbacks. Namely, the repetition of switches Q2-1 to Q2-N can be problematic. Because switches Q1-1/Q2-1 to Q1-N/Q2-N are large to reduce input resistance at high frequency operation, these switches occupy a considerable amount of area. Moreover, the series switches Q1-1/Q2-1 to Q1-N/Q2-N limit the operating speed of ADC 104. Therefore, there is need for an improved mux.

Some examples of conventional circuits are: U.S. Pat. Nos. 6,404,237; 7,064,599; 7,268,610; 7,471,135; and U.S. Patent Pre-Grant Publ. No. 2002/0175740.

SUMMARY

A preferred embodiment of the present invention, accordingly, provides an apparatus. The apparatus comprises a negative voltage rail; a positive voltage rail; a plurality of multiplexer cells, wherein each multiplexer cell is controlled by at least one of a plurality of select signals, and wherein each multiplexer cell is deactivated when a control signal is deasserted, and wherein each multiplexer cell includes: an input terminal; an output terminal; a switch network that is coupled to the negative voltage rail; and a boosted switch that is coupled to the input terminal, the output terminal, and the switch network; and a boost circuit that is coupled to the output terminal of each of the multiplexer cells, the switch network of each multiplexer cell, and the positive voltage rail, wherein the boost circuit is controlled by the control signal.

In accordance with a preferred embodiment of the present invention, the boost circuit further comprises: a first switch that is coupled to the positive voltage rail and to the switch network of each multiplexer cell, wherein the first switch is activated when the control signal is asserted; a second switch that is coupled to the ground and to the output terminal of each multiplexer cell, wherein the second switch is activated when the control signal is asserted; and a capacitor that is coupled between the first and second switches.

In accordance with a preferred embodiment of the present invention, each boosted switch further comprises an NMOS transistor that is coupled to its input terminal at its source, its output terminal at its drain, and its switch network at its gate.

In accordance with a preferred embodiment of the present invention, each switch network further comprises: a third switch that is coupled to the source of its NMOS transistor; a fourth switch that is coupled to between the third switch and its output terminal; a fifth switch that is coupled to a node between the third and fourth switches and to ground; a sixth switch that is coupled between the negative voltage rail and the gate of its NMOS transistor; and a seventh switch that is coupled to between the first switch and the gate of its NMOS transistor.

In accordance with a preferred embodiment of the present invention, the input range of the apparatus is +/−12V, +/−10V, +/−5V, 0V to 10V, and 0V to 5V.

In accordance with a preferred embodiment of the present invention, the negative voltage rail has a voltage of about −15V.

In accordance with a preferred embodiment of the present invention, each multiplexer cell further comprises a transmission gate that is coupled between its output terminal and the boost circuit In accordance with a preferred embodiment of the present invention, an apparatus is provided. The apparatus comprises a negative voltage rail; a positive voltage rail; a multiplexer having a plurality of multiplexer cells, wherein each multiplexer cell is controlled by at least one of a plurality of sets of select signals, and wherein each multiplexer cell includes: an input terminal; an output terminal; a switch network that is coupled to the negative voltage rail; and a boosted switch that is coupled to the input terminal, the output terminal, and the switch network; and a boost circuit that is coupled to the output terminal of each of the multiplexer cells, the switch network of each multiplexer cell, and the positive voltage rail, wherein the boost circuit is controlled by a control signal; an analog-to-digital converter (ADC) that is coupled to the output terminal of each multiplexer cell, wherein the ADC samples an output signal from the multiplexer during a sampling phase and performs a conversion during a conversion phase, and wherein and each multiplexer cell is deactivated during the conversion phase.

In accordance with a preferred embodiment of the present invention, the boost circuit further comprises: a first switch that is coupled to the positive voltage rail and to the switch network of each multiplexer cell; a second switch that is coupled to the ground and to the output terminal of each multiplexer cell, wherein the first and second switched are activated when the control signal is asserted during at least a portion of the sample phase; and a capacitor that is coupled between the first and second switches.

In accordance with a preferred embodiment of the present invention, each set of select signals further comprises a first select signal and a second select signal.

In accordance with a preferred embodiment of the present invention, each boosted switch further comprises an NMOS transistor that is coupled to its input terminal at its source, its output terminal at its drain, and its switch network at its gate.

In accordance with a preferred embodiment of the present invention, each switch network further comprises: a third switch that is coupled to the source of its NMOS transistor and that is controlled by the first select signal of its set of select signals; a fourth switch that is coupled to between the third switch and its output terminal and that is controlled by the first select signal of its set of select signals; a fifth switch that is coupled to a node between the third and fourth switches and to ground, wherein the fifth switch is controlled by the second select signal of its set of select signals; a sixth switch that is coupled between the negative voltage rail and the gate of its NMOS transistor, wherein the sixth switch is controlled by the second select signal of its set of select signals; and a seventh switch that is coupled to between the first switch and the gate of its NMOS transistor, wherein the seventh switch is controlled by the first select signal of its set of select signals.

In accordance with a preferred embodiment of the present invention, the first, second, third, fourth, fifth, sixth, and seventh switches are CMOS switches.

In accordance with a preferred embodiment of the present invention, the apparatus further comprises boost logic that deasserts each of the plurality of sets of select signals during the conversion phase.

In accordance with a preferred embodiment of the present invention, a method for digitizing at least a portion of a selected analog input signal of a plurality of analog input signals by using a multiplexer having a plurality of channels is provided. Each channel is associated with at least one of the analog input signals and is associated with a pair of select signals, and wherein each channel includes a cell having an input terminal, an output terminal, and a boosted NMOS switch. The method comprises asserting a first select signal from each pair of select signals to decouple the input and output terminals for each cell; charging a boost capacitor during an initial portion of a sample phase while the first select signal from each pair of select signals is asserted; asserting a second select signal that is associated with the selected analog input signal so as to couple together the input and output terminals for the cell associated with the selected analog input signal and to provide a voltage stored on the boost capacitor to the associated boosted NMOS switch; and digitizing the portion of the selected analog input signal.

In accordance with a preferred embodiment of the present invention, the step of asserting the first select signal further comprises activating a switch that is coupled to a node between the input and output terminals in each cell so as to ground the node in each cell.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
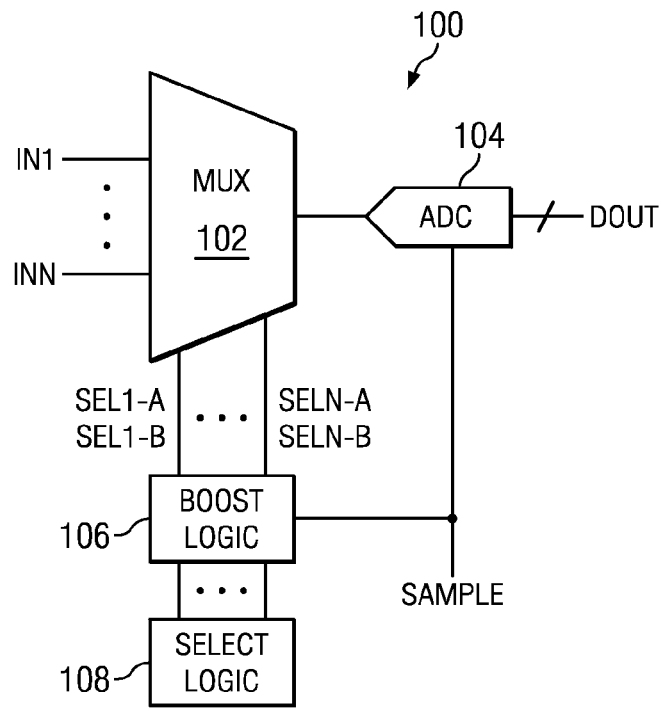
FIG. 1 is an example of a conventional system.

Refer now to the drawings wherein depicted elements are, for the sake of clarity, not necessarily shown to scale and wherein like or similar elements are designated by the same reference numeral through the several views.

Figure 3:
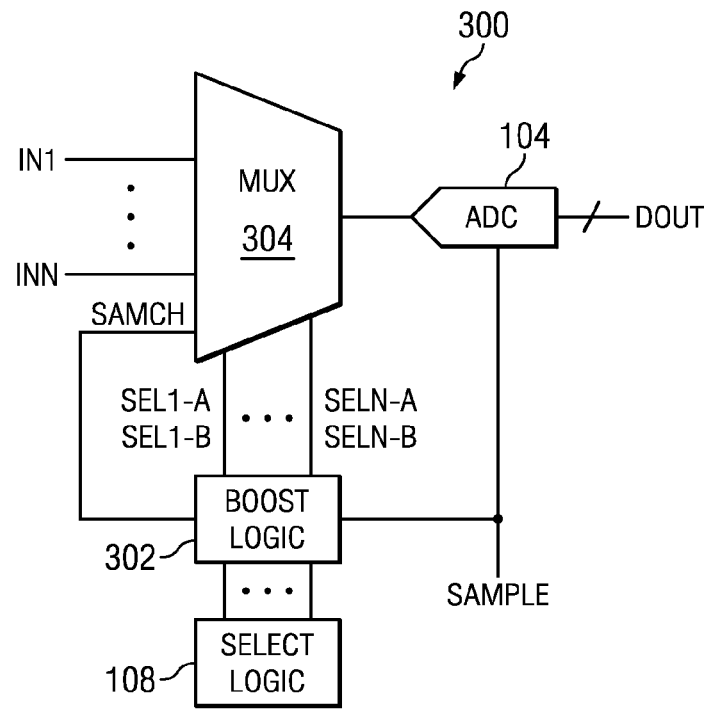
FIG. 3 is an example of a system in accordance with a preferred embodiment of the present invention.
Figure 2:
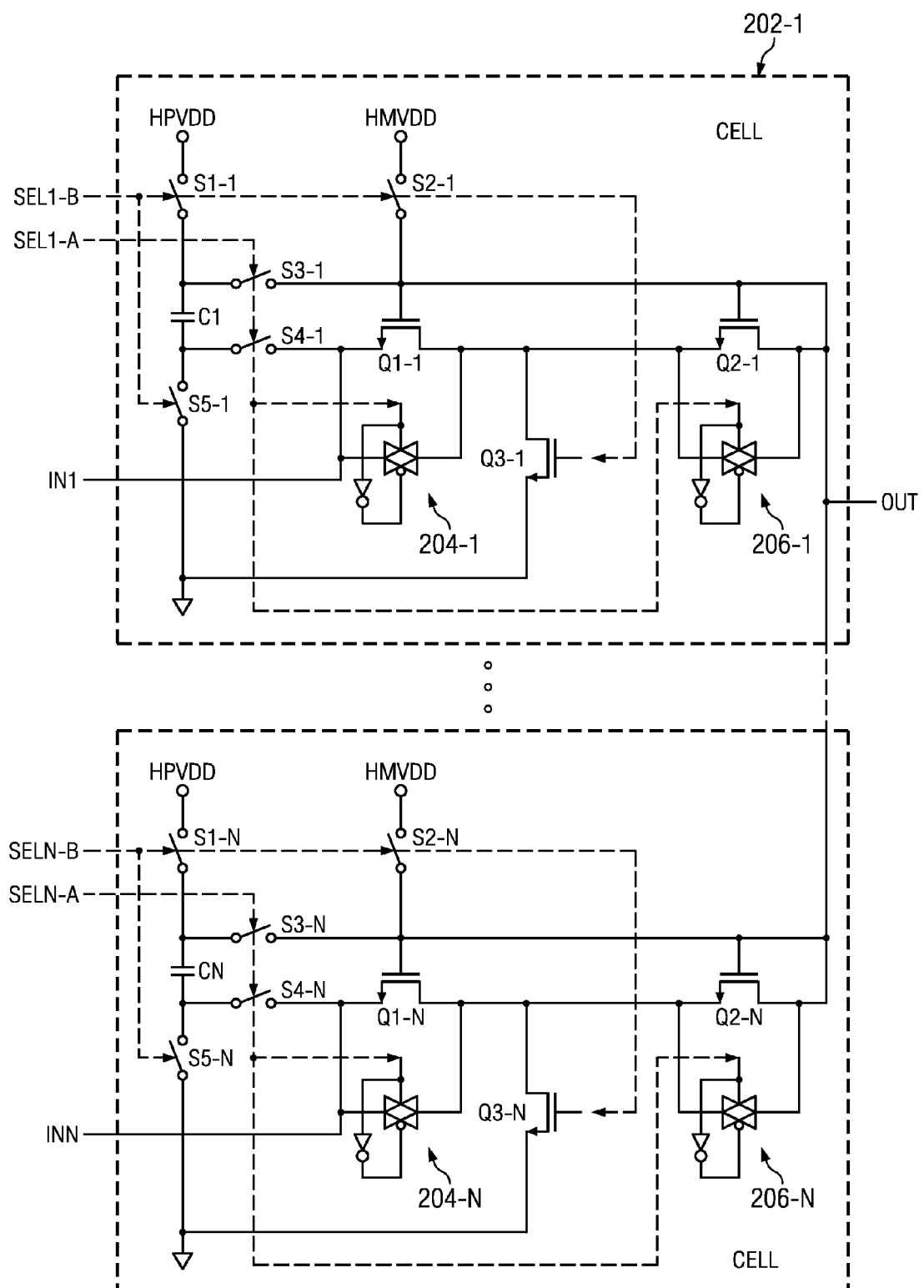
FIG. 2 is an example of the mux of FIG. 1.

Turning to FIG. 3, an example of a system 300 in accordance with a preferred embodiment of the present invention can be seen. This system 300 can generally have input ranges of +/−12V, +/−10V, +/−5V, 0V to 10V, and 0V to 5V, and, in system 300, mux 304 and boost logic 302 generally replace mux 102 and boost logic 106 of system 100. As with mux 102, mux 304 (examples of which can be seen in greater detail in FIGS. 4-6 and which are respectively labeled 304-A, 304-B, and 304-C) is generally comprised of cells 402-1 to 402-N, 501-1 to 502-N, or 602-1 to 602-N; however, each of muxes 304-A, 304-B, and 304-C also includes a boost circuit 404. This boost circuit 404 can reduce the number of boost capacitors (which were provided in each of cells 202-1 to 202-N).

Figure 4:
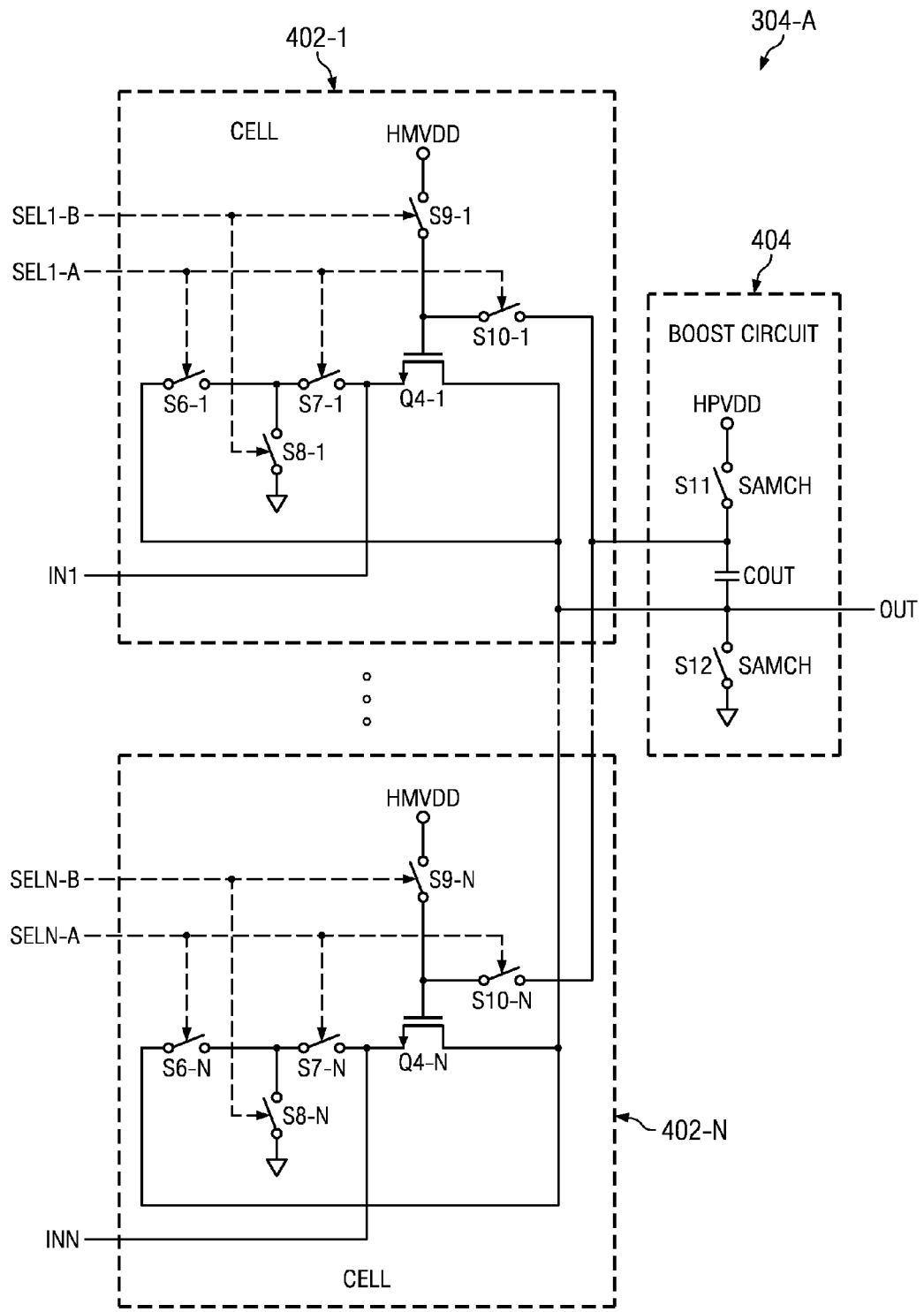
FIGS. 4-6 are examples of the mux of FIG. 3.

Looking first to mux 304-A of FIG. 4, cells 302-1 to 302-N generally and respectively comprise switches S6-1 to S10-1 through S6-N to S10-N (which can be CMOS switches) and boosted switch Q4-1 to Q4-N (which can be NMOS transistors). Boost circuit 404 generally comprises switches S11 and S12 (which can be CMOS switches) and boost capacitor COUT and is controlled by a sample charge signal SAMCH (which is generally provided by boost logic 302 and which generally occurs during the non-sampling phase or conversion phase). Assuming (for example) that the channel associated with cell 402-1 is selected, its input signal IN1 can be transmitted to the ADC 104 during the sampling phase of sample clock signal SAMPLE. During the non-sampling or conversion phase in this example, select signals SEL1-B to SELN-B are asserted while select signals SEL1-A to SELN-A are deasserted. This actuates switches S8-1 to S8-N to ground nodes between the input and output for each cell 302-1 to 302-N and actuates switches S9-1 to S9-N to couple the gates of switches Q4-1 to Q4-N to the negative voltage rail HMVDD (to generally ensure that switches Q4-1 to Q4-N are "off"). Additionally, switches S11 and S12 are actuated by sample charge signal SAMCH (which is generally provided by the boost logic 302) to allow the boost capacitor COUT to be charged to the voltage (i.e., +15V) on positive voltage rail HPVDD. Once boost capacitor COUT is charged, the sample charge signal SAMCH deactivates switches S11 and S12, while select signal SEL1-A (in this example) is asserted and select signals SEL1-B to SELN-B are deasserted. The assertion of select signal SEL1-A actuates switches S6-1, S7-1 and S10-1 so that the output and input terminals of cell 302-1 are coupled together through switches S7-1 and S6-1. Additionally, the top plate of boost capacitor COUT is coupled to the gate of switch Q4-1, allowing the voltage from input signal IN1 at the sampling instant plus the voltage stored on capacitor C1 (i.e., +15V) to be applied to the gate of switch Q4-1. Thus, the voltage from input signal IN1 at the sampling instant can be provided as output signal OUT of mux 304 to ADC 104. Then, during the conversion phase, select signals SEL1-A/SEL1-B to SELN-A/SELN-B are deasserted. This same process can then be applied for each of the cells 402-2 to 402-4, if selected by the selection logic 108.

Mux 304, as shown, can, thus, provide many of the same benefits as mux 102, but does not have the same drawbacks. In mux 304, the number of switches (i.e., Q4-1) per channel or per cell (i.e., 402-1) is reduced, which reduces the area occupied by mux 304 versus mux 102 and does not limit the speed of ADC 104. Additionally, because switches S8-1 to S8-N ground nodes between the input and output terminals of each cell 402-1 to 402-N during the conversion phase and during the sample phase (for unselected channels or cells), crosstalk is reduced. Moreover, because boost circuit 404 is employed, the number of boost capacitors (which typically occupy a significant amount of area) can be reduced.

Figure 5:
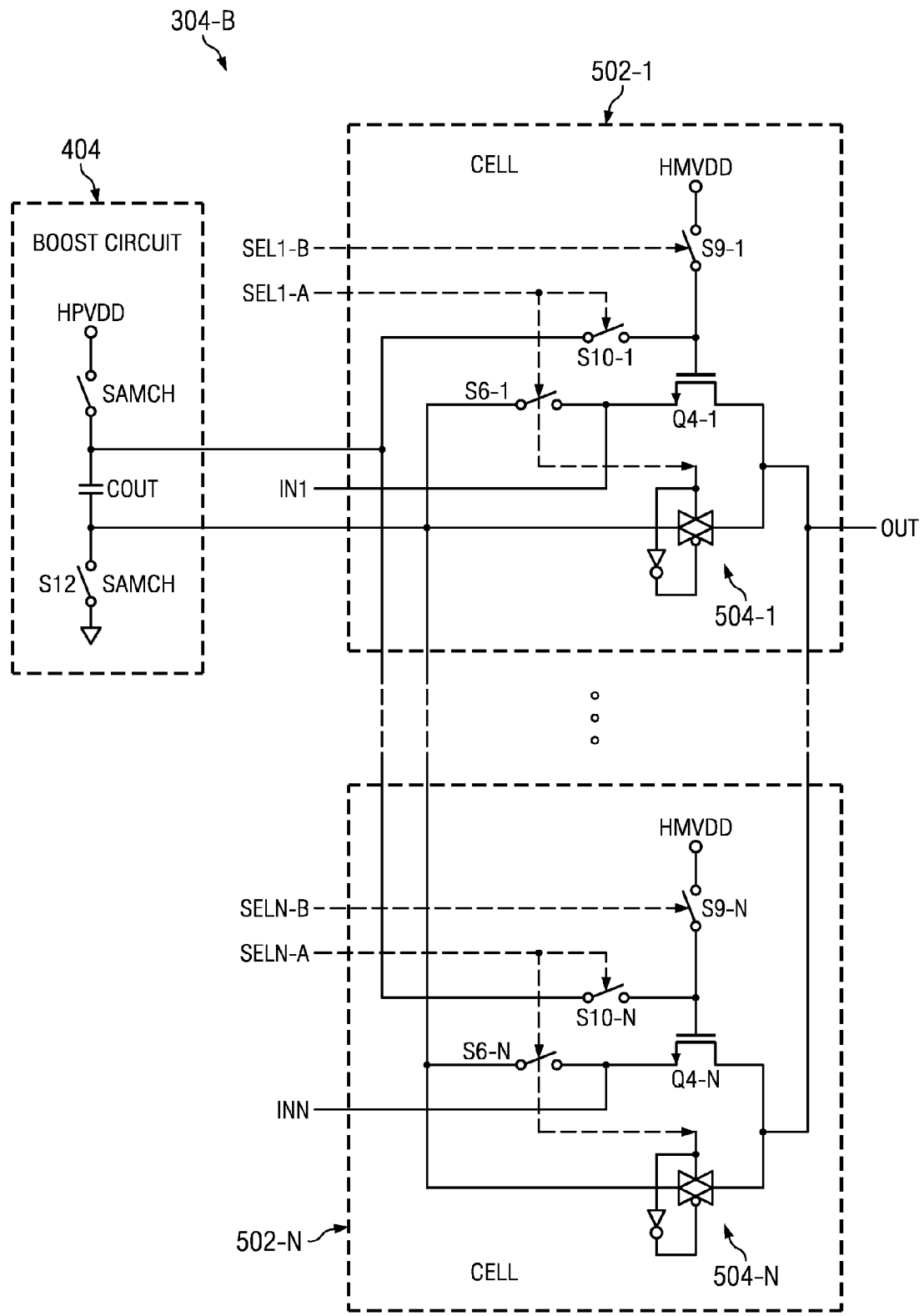

Turning to FIG. 5, an alternative mux 304-B can be seen, which operates in a similar manner to mux 304-A. Differences between muxes 304-A and 304-B generally lie in the configuration of cells 502-1 to 502-N in that switches S7-1 to S7-N and S8-1 to S8-N have been eliminated and that transmission gates 504-1 to 504-N have been included. In this configuration, the bottom plate of boost capacitor COUT is coupled to each of transmission gates 504-1 to 504-N (at a "removed" terminal) instead of the output terminal of each of cells (like mux 304-A). This generally reduces crosstalk at low frequencies as compared to mux 102. Moreover, transmission gates 504-1 to 504-N can be considered to be in parallel having reduced resistance so as to be made smaller, reducing parasitic capacitance and improving settling time.

Figure 6:
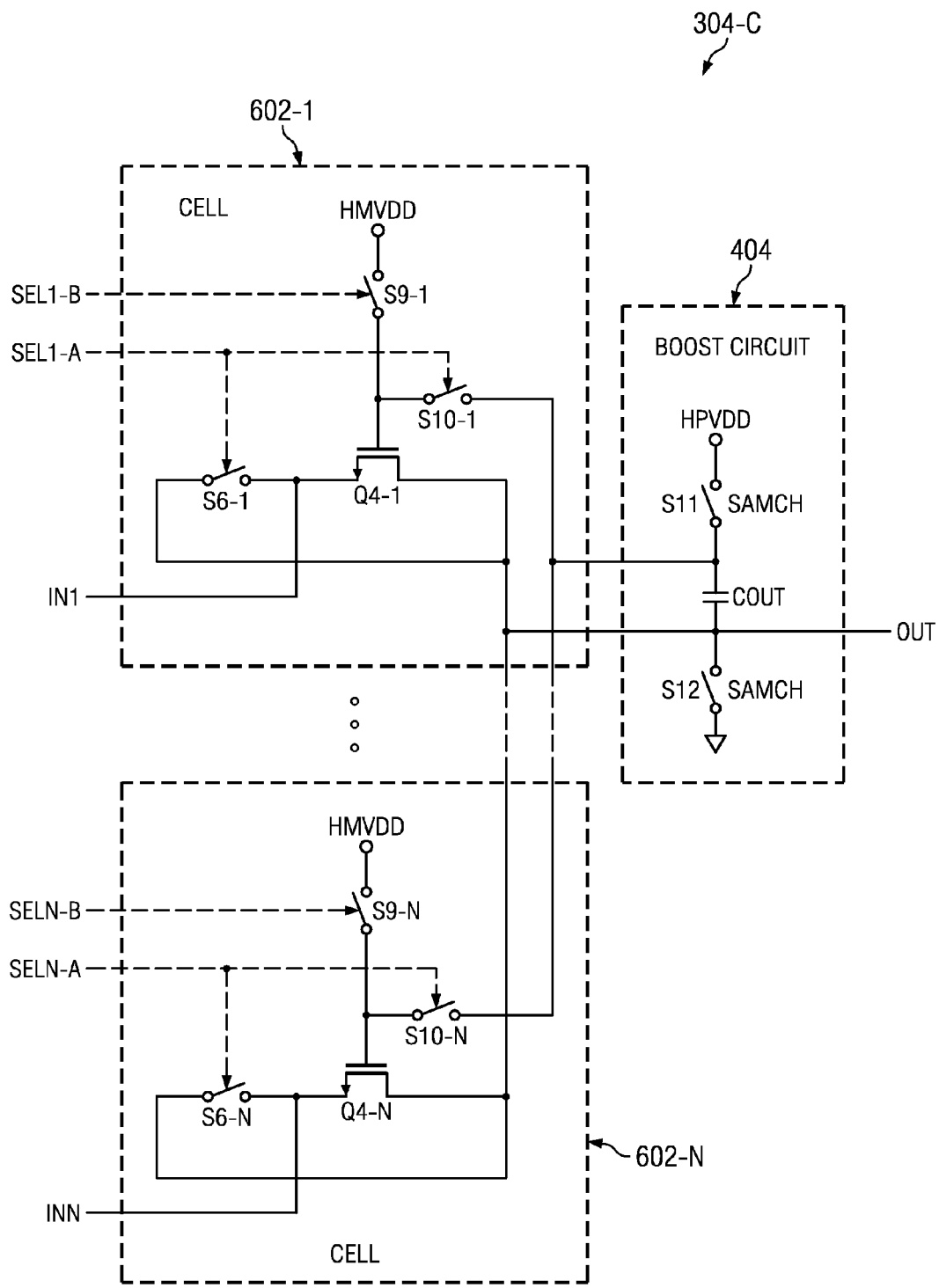

In FIG. 6, another alternative mux 304-C can be seen in greater detail, which operates in a similar manner to mux 304-A. As with mux 304-B, differences between muxes 304-A and 304-C generally lie in the configuration of cells 602-1 to 602-N in that switches S7-1 to S7-N and S8-1 to S8-N. Mux 304-C has an advantage over mux 304-B in that transmission gates 504-1 to 504-N have been eliminated (reducing area). Mux 304-C, though, does not couple a node between the input and output terminals of each unselected cell to ground during sampling (and all cells during conversion) as mux 304-A does, so, there is a performance drawback with mux 304-C versus mux 304-A in terms of crosstalk. However, mux 304-C does occupy less area than mux 304-A (which may be preferable in some applications).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
a negative voltage rail;
a positive voltage rail;
a plurality of multiplexer cells, wherein each multiplexer cell is controlled by at least one of a plurality of select signals, and wherein each multiplexer cell is deactivated when a control signal is deasserted, and wherein each multiplexer cell includes:
an input terminal;
an output terminal;
a switch network that is coupled to the negative voltage rail; and
a boosted switch that is coupled to the input terminal, the output terminal, and the switch network; and
a boost circuit that is coupled to the output terminal of each of the multiplexer cells, the switch network of each multiplexer cell, and the positive voltage rail, wherein the boost circuit is controlled by the control signal,
wherein the boost circuit further comprises:
a first switch that is coupled to the positive voltage rail and to the switch network of each multiplexer cell, wherein the first switch is activated when the control signal is asserted;
a second switch that is coupled to the ground and to the output terminal of each multiplexer cell, wherein the second switch is activated when the control signal is asserted; and
a capacitor that is coupled between the first and second switches, and
wherein each boosted switch further comprises an NMOS transistor that is coupled to the input terminal at the source, the output terminal at the drain, and the switch network at the gate,
wherein each switch network further comprises:
a third switch that is coupled to the source of the NMOS transistor;
a fourth switch that is coupled to between the third switch and the output terminal;
a fifth switch that is coupled to a node between the third and fourth switches and to ground;
a sixth switch that is coupled between the negative voltage rail and the gate of the NMOS transistor; and
a seventh switch that is coupled to between the first switch and the gate of the NMOS transistor.

2. The apparatus of claim 1, wherein the input range of the apparatus is +/−12 V, +/−10 V, +/−5 V, 0 V to 10 V, and 0 V to 5 V.

3. The apparatus of claim 1, wherein the negative voltage rail has a voltage of about −15 V.

4. The apparatus of claim 1, wherein each multiplexer cell further comprises a transmission gate that is coupled between the output terminal and the boost circuit.

5. An apparatus comprising:
a negative voltage rail;
a positive voltage rail;
a multiplexer having a plurality of multiplexer cells, wherein each multiplexer cell is controlled by at least one of a plurality of sets of select signals, and wherein each multiplexer cell includes:
an input terminal;
an output terminal;
a switch network that is coupled to the negative voltage rail; and
a boosted switch that is coupled to the input terminal, the output terminal, and the switch network; and
a boost circuit that is coupled to the output terminal of each of the multiplexer cells, the switch network of each multiplexer cell, and the positive voltage rail, wherein the boost circuit is controlled by a control signal;

an analog-to-digital converter (ADC) that is coupled to the output terminal of each multiplexer cell, wherein the ADC samples an output signal from the multiplexer during a sampling phase and performs a conversion during a conversion phase, and wherein and each multiplexer cell is deactivated during the conversion phase, wherein the boost circuit further comprises:
- a first switch that is coupled to the positive voltage rail and to the switch network of each multiplexer cell
- a second switch that is coupled to the ground and to the output terminal of each multiplexer cell, wherein the first and second switches are activated when the control signal is asserted during at least a portion of the sample phase; and
- a capacitor that is coupled between the first and second switches.

wherein each set of select signals further comprises a first select signal and a second select signal, wherein each boosted switch further comprises an NMOS transistor that is coupled to the input terminal at the source, the output terminal at the drain, and the switch network at the gate, wherein each switch network further comprises:
- a third switch that is coupled to the source of the NMOS transistor and that is controlled by the first select signal of the set of select signals;
- a fourth switch that is coupled to between the third switch and the output terminal and that is controlled by the first select signal of the set of select signals;
- a fifth switch that is coupled to a node between the third and fourth switches and to ground, wherein the fifth switch is controlled by the second select signal of the set of select signals;
- a sixth switch that is coupled between the negative voltage rail and the gate of the NMOS transistor, wherein the sixth switch is controlled by the second select signal of the set of select signals; and
- a seventh switch that is coupled to between the first switch and the gate of the NMOS transistor, wherein the seventh switch is controlled by the first select signal of the set of select signals.

6. The apparatus of claim 5, wherein the input range of the multiplexer is +/−12 V, +/−10 V, +/−5 V, 0 V to 10 V, and 0 V to 5 V.

7. The apparatus of claim 5, wherein the negative voltage rail has a voltage of about −15 V.

8. The apparatus of claim 5, wherein the first, second, third, fourth, fifth, sixth, and seventh switches are CMOS switches.

9. The apparatus of claim 5, wherein the apparatus further comprises boost logic that deasserts each of the plurality of sets of select signals during the conversion phase.

10. The apparatus of claim 5, wherein each multiplexer cell further comprises a transmission gate that is coupled between the output terminal and the boost circuit.

11. A method for digitizing at least a portion of a selected analog input signal of a plurality of analog input signals by using a multiplexer having a plurality of channels, wherein each channel is associated with at least one of the analog input signals, and wherein each channel is associated with a pair of select signals, and wherein each channel includes a cell having an input terminal, an output terminal, and a boosted NMOS switch, the method comprising:
- asserting a first select signal from each pair of select signals to decouple the input and output terminals for each cell;
- charging a boost capacitor during an initial portion of a sample phase while the first select signal from each pair of select signals is asserted;
- asserting a second select signal that is associated with the selected analog input signal so as to couple together the input and output terminals for the cell associated with the selected analog input signal and to provide a voltage stored on the boost capacitor to the associated boosted NMOS switch; and
- digitizing the portion of the selected analog input signal, wherein the step of asserting the first select signal further comprises activating a switch that is coupled to a node between the input and output terminals in each cell so as to ground the node in each cell, wherein the boost capacitor is part of a boost switch, and wherein the boost circuit further comprises:
- a first switch that is coupled to the positive voltage rail and to the switch network of each multiplexer cell, wherein the first switch is activated when the control signal is asserted,
- a second switch that is coupled to the ground and to the output terminal of each multiplexer cell, wherein the second switch is activated when the control signal is asserted; and
- the boost capacitor that is coupled between the first and second switches, and wherein each boosted switch further comprises an NMOS transistor that is coupled to the input terminal at the source, the output terminal at the drain, and the switch network at the gate, wherein each switch network further comprises:
- a third switch that is coupled to the source of the NMOS transistor;
- a fourth switch that is coupled to between the third switch and the output terminal;
- a fifth switch that is coupled to a node between the third and fourth switches and to ground;
- a sixth switch that is coupled between the negative voltage rail and the gate of the NMOS transistor; and
- a seventh switch that is coupled to between the first switch and the gate of the NMOS transistor.

12. The method of claim 11, wherein the input range of the apparatus is +/−12 V, +/−10 V, +/−5 V, 0 V to 10 V, and 0 V to 5 V.

13. The method of claim 11, wherein the negative voltage rail has a voltage of about −15 V.

14. The method of claim 11, wherein each multiplexer cell further comprises a transmission gate that is coupled between the output terminal and the boost circuit.

* * * * *